(12) United States Patent
Yokai

(10) Patent No.: US 7,851,013 B2
(45) Date of Patent: Dec. 14, 2010

(54) UNDERLAY SUBSTRATE, SCREEN PRINTING METHOD AND MANUFACTURING METHOD OF PRINTED CIRCUIT SUBSTRATE

(75) Inventor: Takahiko Yokai, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 474 days.

(21) Appl. No.: 12/043,412

(22) Filed: Mar. 6, 2008

(65) Prior Publication Data

US 2008/0217045 A1 Sep. 11, 2008

Related U.S. Application Data

(60) Provisional application No. 60/893,697, filed on Mar. 8, 2007.

(51) Int. Cl.
*H05K 3/30* (2006.01)
*H05K 3/10* (2006.01)
*B05C 17/06* (2006.01)

(52) U.S. Cl. ........................ 427/98.4; 427/58; 427/96.1; 427/256; 427/282; 427/294; 101/126; 101/129

(58) Field of Classification Search .................. 427/58, 427/96.1, 96.5, 98.4, 256, 282, 287, 294, 427/295; 101/114, 126, 127.1, 129
See application file for complete search history.

(56) References Cited

FOREIGN PATENT DOCUMENTS

| JP | 1-115272 U | 8/1989 |
| JP | 2001-101637 A | 4/2001 |

*Primary Examiner*—Michael Cleveland
*Assistant Examiner*—Lisha Jiang
(74) *Attorney, Agent, or Firm*—Panitch Schwarze Belisario & Nadel LLP

(57) ABSTRACT

A plurality of through holes having an equal size are formed in an underlay substrate. Positions of the plurality of through holes are suitably set according to the shape of a substrate sheet. Specifically, an equal number of through holes are formed in each of end blank corresponding regions that, when the substrate sheet and the underlay substrate are overlapped with each other, overlap with end blank regions of the substrate sheet, of the underlay substrate. In addition, the through holes are formed at equal spacing in portions excluding the end blank corresponding regions in a blank corresponding region, which overlaps with a blank region of the substrate sheet, of the underlay substrate.

2 Claims, 7 Drawing Sheets

F I G. 1
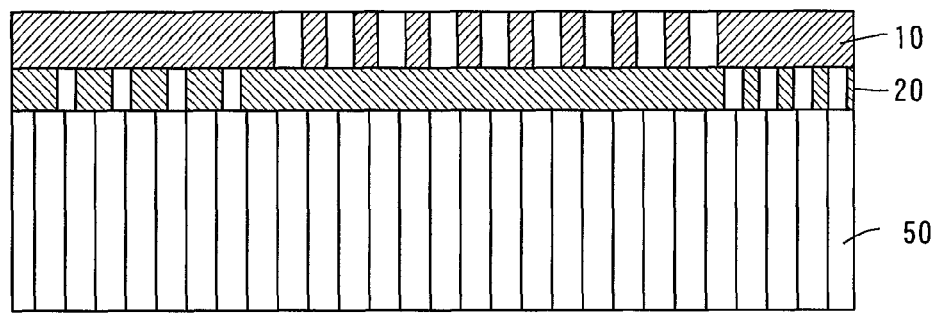

F I G. 5
(d)
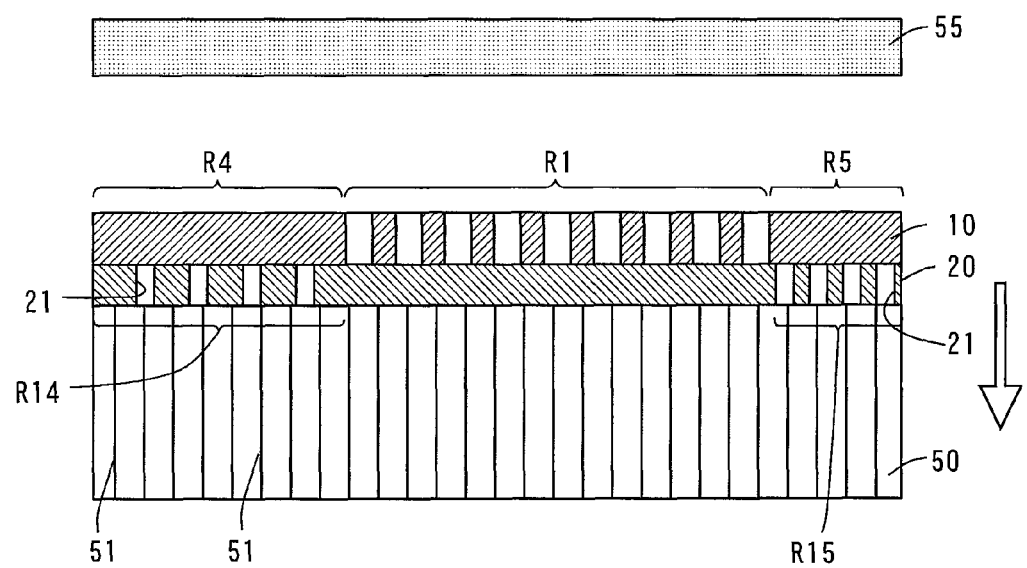

UNDERLAY SUBSTRATE, SCREEN PRINTING METHOD AND MANUFACTURING METHOD OF PRINTED CIRCUIT SUBSTRATE

CROSS-REFERENCE TO RELATED APPLICATION

This application is a non-provisional of U.S. Patent Application No. 60/893,697, filed Mar. 8, 2007, and the disclosure of which is incorporated herein by reference.

BACKGROUND OF THE INVENTION

1. Field of the Invention

The present invention relates to an underlay substrate, and a screen printing method and a manufacturing method of a printed circuit substrate using the same.

2. Description of the Background Art

As a technique for forming a conductive layer, an insulating layer or the like on a substrate, a screen printing is known. In the screen printing, printing ink (conductive paste, insulating paste or the like) is applied on the substrate through a screen plate in which an opening having a predetermined shape is formed while the substrate is fixed on a stage of a screen printing device. Thus, the conductive layer, the insulating layer or the like whose shape corresponds to the shape of the opening of the screen plate is formed on the substrate.

When the screen printing is performed, the substrate is fixed on the stage by, for example, vacuum suction (see JP 1-115272 U, for example).

When the substrate has an asymmetric shape, the substrate may not be sucked onto the stage with a good balance in the vacuum suction of the substrate onto the stage. Specific description is made using FIG. 6.

FIG. 6 is a diagram showing an example of a substrate sheet subjected to the screen printing. As shown in FIG. 6, a plurality of (two in FIG. 6) substrate assembly regions R1 are provided on the substrate sheet 10 so as to extend in parallel with a pair of sides that face each other.

A plurality of substrate formation regions R2 are provided in each of the substrate assembly regions R1. Hereinafter, the above-mentioned pair of sides of the substrate sheet 10 is referred to as lateral sides, and the other pair of sides that is vertical to the lateral sides is referred to as end sides.

Each of the substrate formation regions R2 is subjected to various types of processes, thereby forming printed circuit substrates. In the example shown in FIG. 6, the printed circuit substrates are magnetic head suspension substrates. Openings R3 are formed at portions excluding the plurality of substrate formation regions R2 in each of the substrate assembly regions R1. Ends of each of the substrate formation regions R2 are coupled to a peripheral region of the substrate assembly region R1.

A blank region R10 is formed in a region excluding the substrate assembly regions R1 in the substrate sheet 10. In the blank region R10, end blank regions R4 are provided so as to extend from respective one ends of the substrate assembly regions R1 to one end side of the substrate sheet 10. In addition, end blank regions R5 are provided so as to extend from the respective other ends of the substrate assembly regions R1 to the other end side of the substrate sheet 10 in the blank region R10. Normally, the end blank regions R4, R5 are formed such that their respective areas are different from each other. Therefore, a region on one side of the blank region R10 and a region on the other side of the blank region R10 have different areas from each other with a center line CL1 passing through the respective centers of the both lateral sides of the substrate sheet 10 as its boundary.

In the vacuum suction of the substrate sheet 10 onto the stage, the suction force is proportional to a contact area between the substrate sheet 10 and the stage. In this substrate sheet 10, the suction force onto the stage is different in the region on the one side and the region on the other side with the center line CL1 as its boundary. Therefore, the substrate sheet 10 is not sucked onto the stage with the good balance.

After the printing ink is applied onto the substrate sheet 10, the stage is lowered, so that the substrate sheet 10 is separated from the screen plate. Here, if the substrate sheet 10 is not sucked onto the stage with the good balance, the following problems are prone to occur.

FIG. 7 is a diagram for explaining the problems in the conventional screen printing. As shown in FIG. 7, viscosity of the printing ink causes a part of the substrate sheet 10 to remain adhered to the screen plate, thereby moving the part of the substrate sheet 10 away from the stage in some cases. In such a case, the substrate sheet 10 is liable to be folded, thereby causing the substrate sheet 10 or the conductive layer or the like on the substrate sheet 10 to be damaged.

SUMMARY OF THE INVENTION

An object of the present invention is to provide an underlay substrate for preventing a substrate sheet from being folded at the time of separating the substrate sheet from a screen plate, and a screen printing method and a manufacturing method of a printed circuit substrate using the same.

(1) According to an aspect of the present invention, an underlay substrate is arranged between a substrate sheet for manufacturing a printed circuit substrate and a suction stage when the substrate sheet is fixed on the suction stage by vacuum suction, wherein the substrate sheet is sectioned into first and second regions having an equal area, the first region includes a first printed circuit substrate formation region and a first blank region, the second region includes a second printed circuit substrate formation region and a second blank region, an area of the first blank region and an area of the second blank region are different from each other, the underlay substrate includes first and second blank corresponding regions that, when the underlay substrate is overlapped with the substrate sheet, face the first and second blank regions of the substrate sheet, respectively, one or plurality of first through holes are formed in the first blank corresponding region and one or plurality of second through holes are formed in the second blank corresponding region, and a sum of areas of the first through holes and a sum of areas of the second through holes are equal to each other.

When this underlay substrate is arranged between the substrate sheet and the suction stage, the first blank corresponding region in which the first through holes are formed faces the first blank region of the substrate sheet, and the second blank corresponding region in which the second through holes are formed faces the second blank region of the substrate sheet.

In this state, the first blank region of the substrate sheet is sucked onto the suction stage under vacuum through the first through holes of the underlay substrate, and the second blank region of the substrate sheet is sucked onto the suction stage under vacuum through the second through holes of the underlay substrate. This causes the substrate sheet to be fixed on the suction stage.

While the area of the first blank region of the substrate sheet and the area of the second blank region of the substrate sheet are different from each other, the sum of the areas of the first through holes and the sum of the areas of the second through holes are equal to each other. This causes force to suck the substrate sheet onto the suction stage to be equal in the first blank region and the second blank region. Thus, the substrate sheet is sucked onto the suction stage with a good balance.

In the state, the substrate sheet is subjected to the screen printing. After the printing, the substrate sheet and the screen plate are separated from each other. Here, since the substrate sheet is sucked onto the suction stage with the good balance, the substrate sheet is reliably separated from the screen plate.

This prevents a part of the substrate sheet from moving away from the suction stage and remaining adhered to the screen plate. As a result, the substrate sheet is prevented from being folded and the substrate sheet or a conductive layer or the like on the substrate sheet is prevented from being damaged.

(2) An area of each of the first through holes and an area of each of the second through holes may be equal to each other, and the number of the first through holes and the number of the second through holes may be equal to each other such that the sum of the areas of the first through holes and the sum of the areas of the second through holes are equal to each other.

In this case, since the area of each of the first through holes and the area of each of the second through holes are equal to each other, the sum of the areas of the first through holes and the sum of the areas of the second through holes become equal by setting the respective numbers of the first through holes and the second through holes to be equal to each other.

The sum of the areas of the first through holes and the sum of the areas of the second through holes are equal to each other, so that the substrate sheet is sucked onto the suction stage with the good balance.

(3) The number of the first through holes and the number of the second through holes may be different from each other, and the area of each of the first through holes and the area of each of the second through holes may be different from each other such that the sum of the areas of the first through holes and the sum of the areas of the second through holes are equal to each other.

In this case, since the first through holes and the second through holes are different in number, the area of each of the first through holes and the area of each of the second through holes are set to be different from each other in order for the sum of the areas of the first through holes and the sum of the areas of the second through holes to be equal to each other.

The sum of the areas of the first through holes and the sum of the areas of the second through holes are equal to each other, so that the substrate sheet is sucked onto the suction stage with the good balance.

(4) The substrate sheet may have a rectangular shape having a pair of lateral sides and a pair of end sides, the first and second printed circuit substrate formation regions may be successively arranged so as to extend along the pair of lateral sides of the substrate sheet, the first blank region may include a first end blank region that is arranged between an end of the first printed circuit substrate formation region and one end side of the substrate sheet, the second blank region may include a second end blank region that is arranged between an end of the second printed circuit substrate formation region and the other end side of the substrate sheet, the first end blank region and the second end blank region may have different areas, the underlay substrate may include first and second end blank corresponding regions that, when the underlay substrate is overlapped with the substrate sheet, face the first and second end blank regions of the substrate sheet, respectively, and a sum of areas of the first through holes in the first end blank corresponding region and a sum of areas of the second through holes in the second end blank corresponding region may be equal to each other.

In this case, the sum of the areas of the first through holes in the first end blank corresponding region and the sum of the areas of the second through holes in the second end blank corresponding region are equal to each other, so that the force to suck the first end blank region of the substrate sheet onto the suction stage and the force to suck the second end blank region of the substrate sheet onto the suction stage become equal to each other.

Therefore, when the sum of the areas of the first through holes formed in the first blank region excluding the first end blank region in the substrate sheet and the sum of the areas of the second through holes formed in the second blank region excluding the second end blank region in the substrate sheet are equal to each other, the force to suck the substrate sheet onto the suction stage is equal in the first blank region and the second blank region. This causes the substrate sheet to be sucked onto to the suction stage with the good balance.

(5) According to another aspect of the present invention, a screen printing method includes the steps of fixing a substrate sheet for manufacturing a printed circuit substrate on a suction stage by vacuum suction with an underlay substrate sandwiched therebetween, arranging a screen plate on the substrate sheet, printing a material on the substrate sheet through the screen plate, and separating the substrate sheet from the screen plate, wherein the substrate sheet is sectioned into first and second regions having an equal area, the first region includes a first printed circuit substrate formation region and a first blank region, the second region includes a second printed circuit substrate formation region and a second blank region, an area of the first blank region and an area of the second blank region are different from each other, the underlay substrate includes first and second blank corresponding regions that, when the underlay substrate is overlapped with the substrate sheet, face the first and second blank regions of the substrate sheet, respectively, one or plurality of first through holes are formed in the first blank corresponding region, one or plurality of second through holes are formed in the second blank corresponding region, and a sum of areas of the first through holes and a sum of areas of the second through holes are equal to each other.

In this screen printing method, the substrate sheet for manufacturing the printed circuit substrate is fixed on the suction stage by vacuum suction with the underlay substrate sandwiched therebetween.

With the substrate sheet placed on the suction stage, the first blank corresponding region, in which the first through holes are formed, of the underlay substrate faces the first blank region of the substrate sheet, and the second blank corresponding region, in which the second through holes are formed, of the underlay substrate faces the second blank region of the substrate sheet.

The first blank region of the substrate sheet is sucked onto the suction stage under vacuum through the first through holes of the underlay substrate, and the second blank region of the substrate sheet is sucked onto the suction stage under vacuum through the second through holes of the underlay substrate, so that the substrate sheet is fixed on the suction stage.

Although the area of the first blank region of the substrate sheet and the area of the second blank region of the substrate sheet are different from each other, the sum of the areas of the first through holes and the sum of the areas of the second through holes are equal to each other. Therefore, the force to suck the substrate sheet onto the suction stage is equal in the first blank region and the second blank region. This causes the substrate sheet to be sucked onto the suction stage with the good balance.

With the substrate sheet fixed on the suction stage by vacuum suction, the screen plate is arranged on the substrate sheet. Then, the material is printed on the substrate sheet through the screen plate. After the printing, the substrate sheet and the screen plate are separated from each other. Since the substrate sheet is sucked onto the suction stage with the good balance, the substrate sheet is reliably separated from the screen plate.

This prevents the part of the substrate sheet from moving away from the suction stage and remaining adhered to the screen plate. As a result, the substrate sheet is prevented from being folded, and the substrate sheet or the conductive layer or the like on the substrate sheet is prevented from being damaged.

(6) According to still another aspect of the present invention, a manufacturing method of a printed circuit substrate includes the steps of fixing a substrate sheet for manufacturing the printed circuit substrate on a suction stage by vacuum suction with an underlay substrate sandwiched therebetween, arranging a screen plate on the substrate sheet, printing a material on the substrate sheet through the screen plate, separating the substrate sheet from the screen plate, and detaching the printed circuit substrate from the substrate sheet, wherein the substrate sheet is sectioned into first and second regions having an equal area, the first region includes a first printed circuit substrate formation region and a first blank region, the second region includes a second printed circuit substrate formation region and a second blank region, an area of the first blank region and an area of the second blank region are different from each other, the underlay substrate includes first and second blank corresponding regions that, when the underlay substrate is overlapped with the substrate sheet, face the first and second blank regions of the substrate sheet, respectively, one or plurality of first through holes are formed in the first blank corresponding region, one or plurality of second through holes are formed in the second blank corresponding region, and a sum of areas of the first through holes and a sum of areas of the second through holes are equal to each other.

In the manufacturing method of the printed circuit substrate, the substrate sheet for manufacturing the printed circuit substrate is fixed on the suction stage by the vacuum suction with the underlay substrate sandwiched therebetween.

With the substrate sheet placed on the suction stage, the first blank corresponding region, in which the first through holes are formed, of the underlay substrate faces the first blank region of the substrate sheet, and the second blank corresponding region, in which the second through holes are formed, of the underlay substrate faces the second blank region of the substrate sheet.

When the substrate sheet is fixed on the suction stage by the vacuum suction, the first blank region of the substrate sheet is sucked onto the suction stage under vacuum through the first through holes of the underlay substrate, and the second blank region of the substrate sheet is sucked onto the suction stage under vacuum through the second through holes of the underlay substrate.

While the area of the first blank region of the substrate sheet and the area of the second blank region of the substrate sheet are different from each other, the sum of the areas of the first through holes and the sum of the areas of the second through holes are equal to each other. This causes the force to suck the substrate sheet onto the suction stage to be equal in the first blank region and the second blank region. Thus, the substrate sheet is sucked onto to the suction stage with the good balance.

With the substrate sheet fixed on the suction stage by the vacuum suction, the screen plate is arranged on the substrate sheet. Then, the material is printed on the substrate sheet through the screen plate. After the printing, the substrate sheet and the screen plate are separated from each other. Thereafter, the printed circuit substrate is detached from the substrate sheet, and consequently, the printed circuit substrate is completed. In a process of separating the screen plate from the substrate sheet, the substrate sheet is reliably separated from the screen plate since the substrate sheet is sucked onto the suction stage with the good balance.

This prevents the part of the substrate sheet from moving away from the suction stage and remaining adhered to the screen plate. Accordingly, the substrate sheet is prevented from being folded, and the substrate sheet or the conductive layer or the like on the substrate sheet is prevented from being damaged.

According to the present invention, the substrate sheet is sucked onto the suction stage with the good balance. Therefore, the substrate sheet is reliably separated from the screen plate, thereby preventing the part of the substrate sheet from moving away from the suction stage and remaining adhered to the screen plate. As a result, the substrate sheet is prevented from being folded, and the substrate sheet or the conductive layer or the like on the substrate sheet is prevented from being damaged.

Other features, elements, characteristics, and advantages of the present invention will become more apparent from the following description of preferred embodiments of the present invention with reference to the attached drawings.

BRIEF DESCRIPTION OF THE DRAWINGS

FIG. 1 is a schematic view for explaining a screen printing method according to the present embodiment;

FIG. 5 is a schematic view for explaining the summary of the screen printing for the substrate sheet;

DESCRIPTION OF THE PREFERRED EMBODIMENTS

Hereinafter, description is made of a screen printing method, a manufacturing method of a printed circuit substrate and an underlay substrate according to an embodiment of the present invention while referring to drawings.

Figure 6:
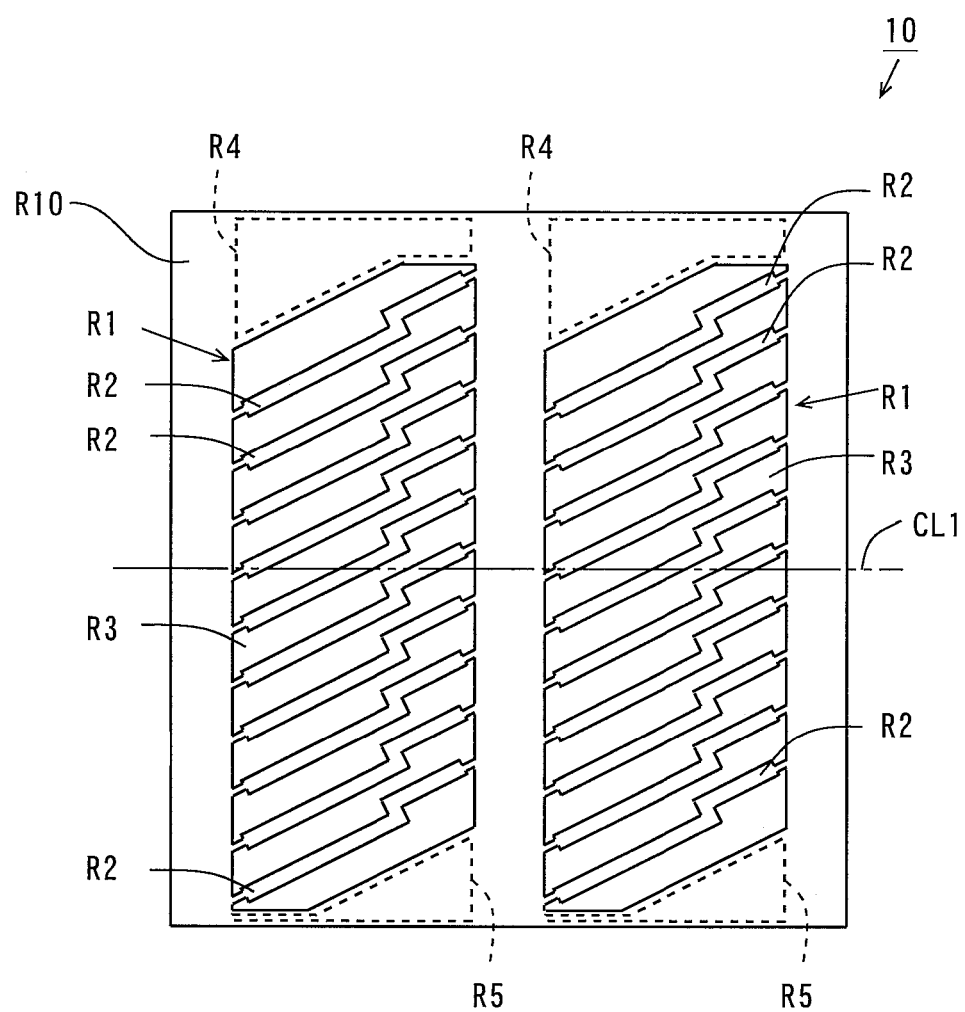
FIG. 6 is a diagram showing an example of the substrate sheet subjected to the screen printing.
Figure 7:
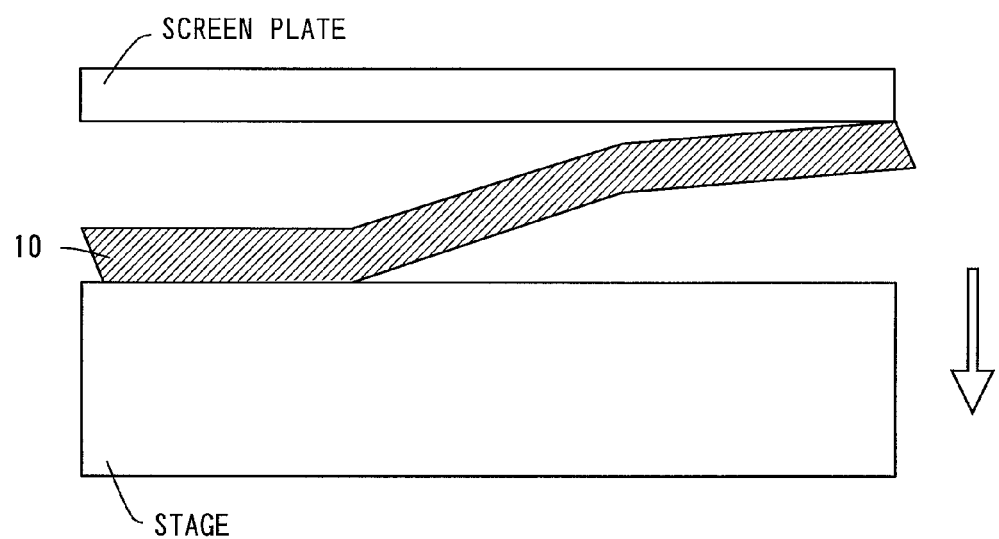
FIG. 7 is a diagram for explaining problems in a conventional screen printing.

FIG. 1 is a diagram showing a state where a substrate sheet 10 shown in FIG. 6 is sucked onto a stage of a screen printing device under vacuum in a screen printing method according to the present invention. As shown in FIG. 1, the substrate sheet 10 is sucked onto the stage 50 under vacuum with an underlay substrate 20 sandwiched therebetween in the present embodiment.

(1) The Underlay Substrate

Figure 2:
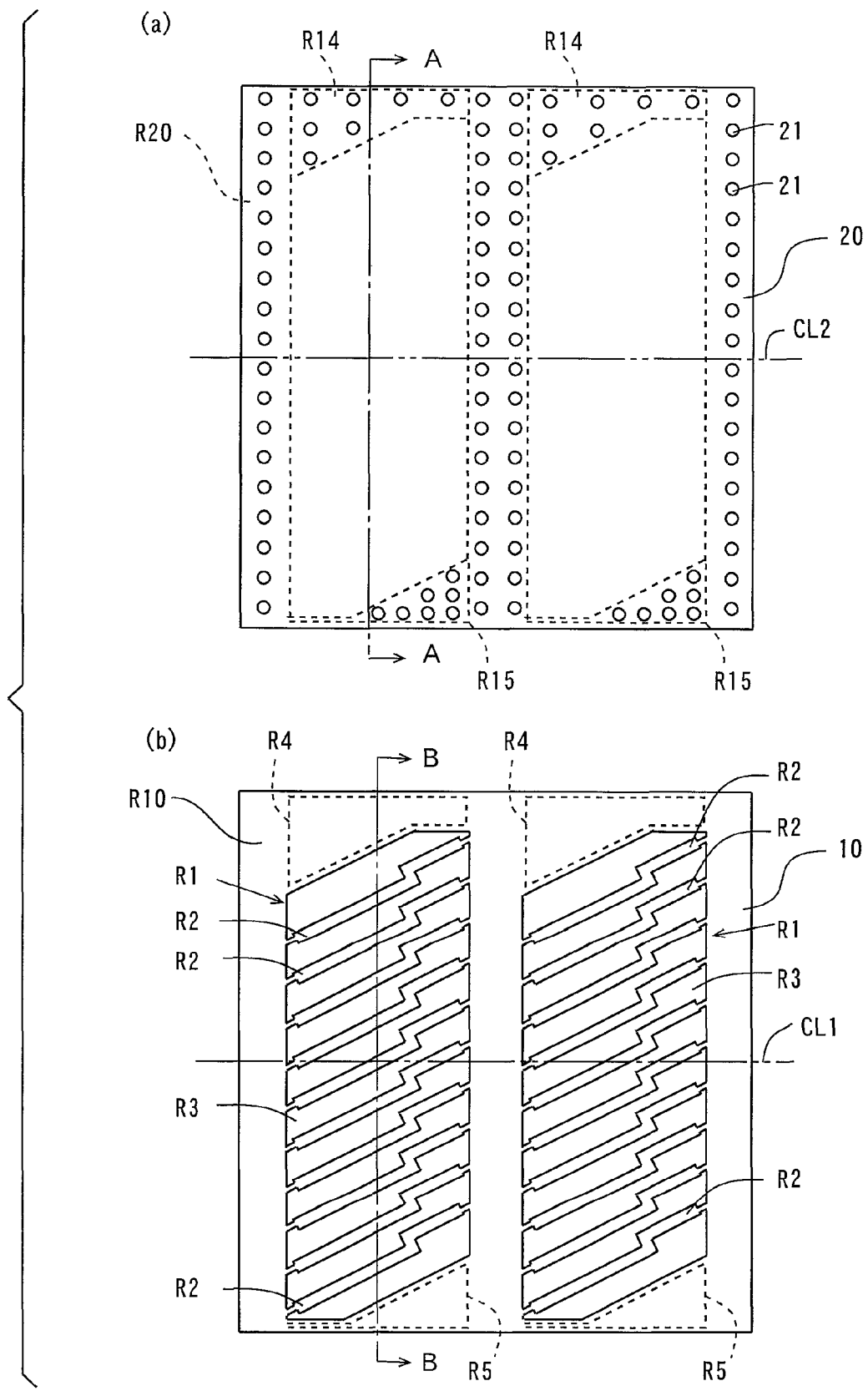
FIG. 2 is a diagram showing an underlay substrate and a substrate sheet used in the present embodiment.

Description is made of the underlay substrate 20. FIG. 2(a) is a diagram showing the underlay substrate according to the present embodiment, and FIG. 2(b) is a diagram showing the substrate sheet 10. Note that the underlay substrate 20 has substantially the same size as the substrate sheet 10 as shown in FIG. 1 and FIG. 2.

A configuration of the substrate sheet 10 shown in FIG. 2(b) is the same as a configuration of the substrate sheet 10 shown in FIG. 6. That is, a plurality of (two in FIG. 2(b)) substrate assembly regions R1 are provided in the substrate sheet 10 so as to extend in parallel with a pair of sides that face each other. A plurality of substrate formation regions R2 are provided in each of the substrate assembly regions R1.

Hereinafter, the above-mentioned pair of sides of the substrate sheet 10 is referred to as lateral sides, and the other pair of sides that is vertical to the lateral sides is referred to as end sides. In addition, a pair of sides, corresponding to the pair of lateral sides of the substrate sheet 10, of the underlay substrate 20 is referred to as lateral sides, and a pair of sides, corresponding to the pair of end sides of the substrate sheet 10, of the underlay substrate 20 is referred to as end sides.

Each of the substrate formation regions R2 is subjected to various types of processes, thereby forming a printed circuit substrate. Details of each of the substrate formation regions R2 will be described later. Openings R3 are formed at portions excluding the plurality of substrate formation regions R2 in each of the substrate assembly regions R1. Ends of each of the substrate formation regions R2 are coupled to a peripheral region of the substrate assembly region R1.

A blank region R10 is formed in a region excluding the substrate assembly regions R1 in the substrate sheet 10. In the blank region R10, end blank regions R4 are provided so as to extend from respective one ends of the substrate assembly regions R1 to one end side of the substrate sheet 10. In addition, end blank regions R5 are provided so as to extend from the respective other ends of the substrate assembly regions R1 to the other end side of the substrate sheet 10. Normally, the end blank regions R4, R5 are formed such that their areas are different from each other. Therefore, a portion excluding the openings R3 in a region on one side and a portion excluding the openings R3 in a region on the other side have different areas with a center line CL1 passing through the respective centers of the both lateral sides of the substrate sheet 10 as its boundary.

As shown in FIG. 2(a), a plurality of through holes 21 having the same size are formed in the underlay substrate 20. Positions of the plurality of through holes 21 are suitably set according to the shape of the substrate sheet 10.

Specifically, an equal number of through holes 21 (seven in FIG. 2) are formed in each of end blank corresponding regions R14, R15 that, when the substrate sheet 10 and the underlay substrate 20 are overlapped with each other, overlap with the end blank regions R4, R5 of the substrate sheet 10, of the underlay substrate 20.

In addition, the through holes 21 are formed at equal spacing in portions excluding the end blank corresponding regions R14, R15 in a blank corresponding region R20, which overlap with the blank region R10 of the substrate sheet 10, of the underlay substrate 20. Note that although the through holes 21 are not formed in regions, which overlap with the substrate formation regions R2 of the substrate sheet 10, of the underlay substrate 20 in FIG. 2, the through holes 21 are formed also in the regions, which overlap with the substrate formation regions R2, of the underlay substrate 20 in practice.

Thus, the numbers of the through holes 21 are equal in the region on the one side and the region on the other side of the blank corresponding region R20 with a center line CL2 passing through the respective centers of the both lateral sides of the underlay substrate 20 as its boundary.

Note that the thickness of the underlay substrate 20 is preferably 100-700 μm. A metallic plate such as stainless steel, aluminum or copper is preferably used as a material for the underlay substrate 20. The total areas of the through holes 21 is preferably 25-100 mm$^2$ in the end blank corresponding regions R14 of the underlay substrate 20 and in the end blank corresponding regions R15 of the underlay substrate 20, respectively. The diameter of each of the through hole 21 is preferably 0.3-2.0 mm.

(2) The Substrate Formation Regions of the Substrate Sheet

Hereinafter, description is made of the details of the substrate formation regions R2 of the substrate sheet 10 shown in FIG. 2(b). Magnetic head suspension substrates are formed in the substrate formation regions R2.

Figure 3:
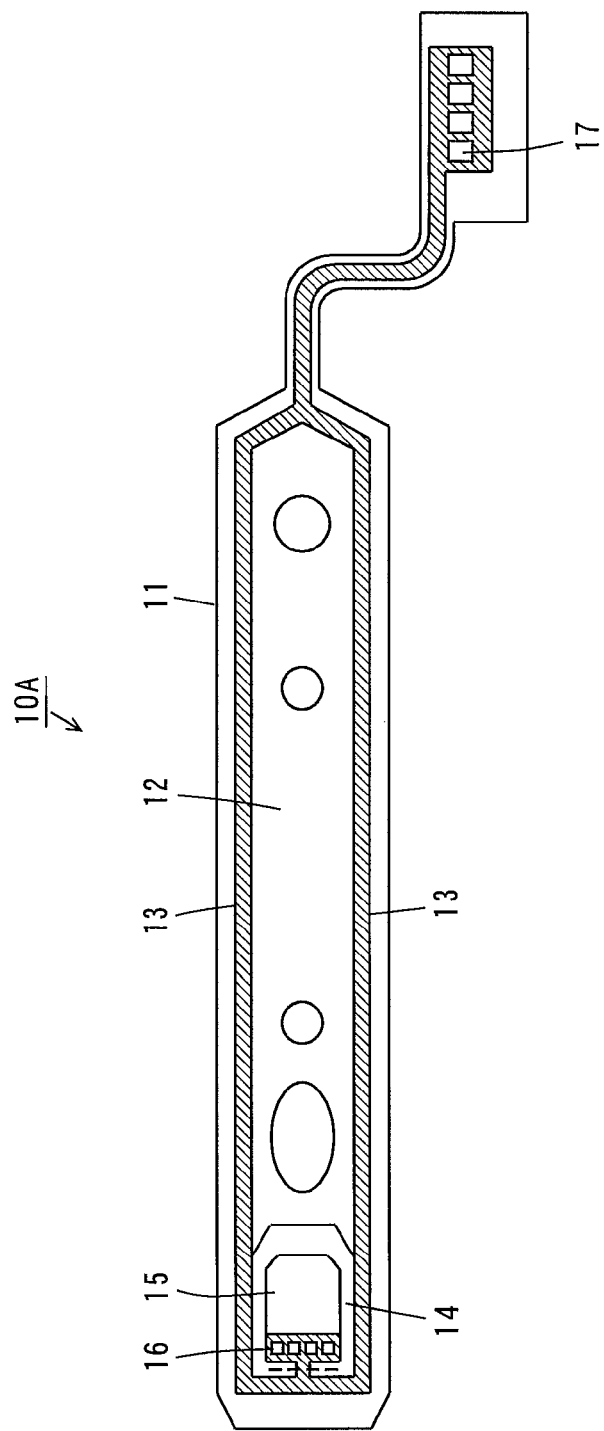
FIG. 3 is a diagram showing a magnetic head suspension substrate.

FIG. 3 is a diagram showing the magnetic head suspension substrate. As shown in FIG. 3, the magnetic head suspension substrate 10A includes a suspension body 12 formed of along-sized substrate 11 made of stainless steel.

A wiring pattern 13 is formed on the suspension body 12. A U-shaped opening 14 is formed at the tip of the suspension body 12, thereby providing a magnetic head supporting portion 15.

Four electrode pads 16 are formed at an end of the magnetic head supporting portion 15, and four electrode pads 17 are formed at the other tip of the suspension body 12. The electrode pads 16 and the electrode pads 17 are connected to one another by the wiring pattern 13.

Each of the magnetic head suspension substrates 10A is detached from the substrate sheet 10, and used in a hard disk or the like.

(3) Summary of the Screen Printing

Figure 4:
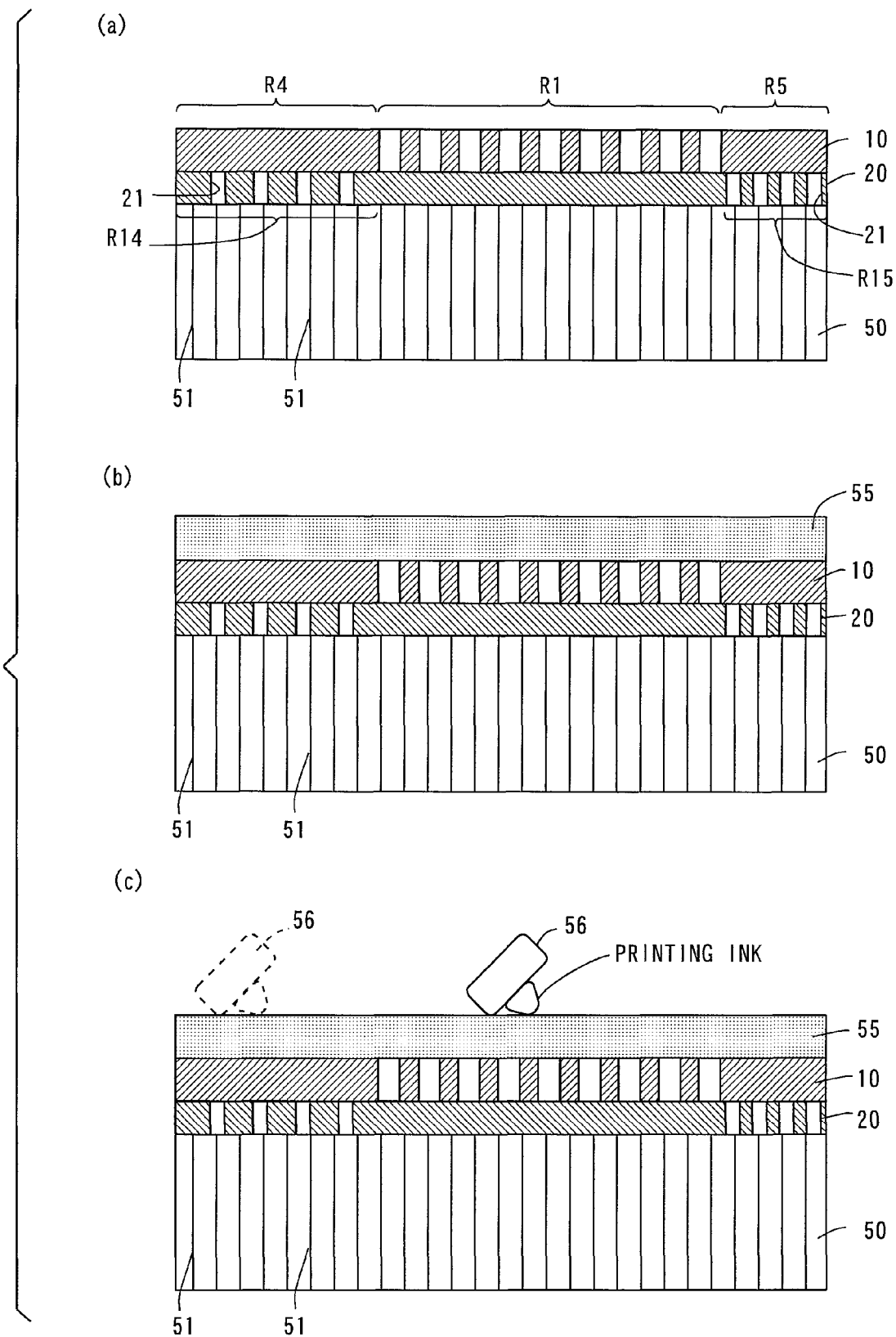
FIG. 4 is a diagram for explaining a summary of a screen printing for the substrate sheet.

Hereinafter, description is made of a summary of the screen printing method according to the present embodiment. FIG. 4 and FIG. 5 are schematic views for explaining the summary of the screen printing method according to the present embodiment. Note that in FIG. 4 and FIG. 5, the underlay substrate 20 is shown in cross section taken along the line A-A of FIG. 2(a), and the substrate sheet 10 is shown in cross section taken along the line B-B of FIG. 2(b).

First, the substrate sheet 10 and the underlay substrate 20 are placed on the stage 50 of the screen printing device so as to vertically overlap with each other as shown in FIG. 4(a). The plurality of exhaust paths 51 are provided in the stage 50. Each of the exhaust paths 51 opens at an upper surface of the stage 50.

An atmosphere within the exhaust paths 51 is exhausted by a vacuum device that is not shown, so that the underlay substrate 20 is sucked onto the stage 50 under vacuum while the substrate sheet 10 is sucked onto the stage 50 under vacuum through the plurality of through holes 21 of the underlay substrate 20.

Here, a force to suck the substrate sheet 10 onto the stage 50 is proportional to areas of portions in which a lower surface of the substrate sheet 10 and the upper surface of the stage 50 are communicated with each other. That is, the force is proportional to the number (area) of the through holes 21 of the underlay substrate 20.

As described above, the equal number of through holes 21 are formed in each of the end blank corresponding regions R14, R15 of the underlay substrate 20, and the numbers of the through holes 21 are substantially equal in the region on the one side and the region on the other side of the blank corresponding region R20 with the center line CL2 (FIG. 2(a) as its boundary.

Therefore, the force to suck the substrate sheet 10 onto the stage 50 is substantially equal in the region on the one side and the region on the other side with the center line CL1 (FIG. 2(b)) as its boundary. Thus, the substrate sheet 10 is sucked onto the stage 50 with a good balance.

Note that the suction force of the vacuum device that is not shown is adjusted such that the substrate sheet 10 can be easily separated from the stage 50. In this case, since the substrate sheet 10 on the stage 50 can be exchanged without stopping the vacuum device, the plurality of substrate sheets 10 can be continuously processed without switching a state of the vacuum device between an operating state and a stopped state.

The stage 50 is lifted with the underlay substrate 20 and the substrate sheet 10 sucked onto the stage 50 as shown in FIG. 4(b), so that the substrate sheet 10 comes into contact with the screen plate 55. In the state, a squeegee 56 applies the printing ink onto the substrate sheet 10 through the openings formed in the screen plate 55 while moving on the screen plate 55 in one direction as shown in FIG. 4(c). Accordingly, the conductive layer or the like is formed on the substrate sheet 10.

Then, the stage 50 is lowered, so that the substrate sheet 10 is separated from the screen plate 55 as shown in FIG. 5(d). In the present embodiment, the substrate sheet 10 is sucked onto the stage 50 with the good balance, so that the substrate sheet 10 is reliably separated from the screen plate 55.

(4) Effects of the Embodiment

In the present embodiment, the substrate sheet 10 is sucked onto the stage 50 under vacuum with the underlay substrate 20 sandwiched therebetween. The equal number of through holes 21 are formed in each of the end blank corresponding regions R14, R15, which overlap with the end blank regions R4, R5 of the substrate sheet 10, of the underlay substrate 20.

Thus, the substrate sheet 10 is sucked onto the stage 50 with the good balance. This prevents a part of the substrate sheet 10 from moving away from the stage 50 and remaining adhered to the screen plate 55 at the time of separating the substrate sheet 10 from the screen plate 55 by lowering the stage 50. As a result, the substrate sheet 10 is prevented from being folded, and the substrate sheet 10 or the conductive layer or the like on the substrate sheet 10 are prevented from being damaged.

(5) Another Embodiment

Although the force to suck the substrate sheet 10 onto the stage 50 is adjusted by adjusting the number of the through holes 21 of the underlay substrate 20 in the above-described embodiment, the present invention is not limited to this. The force to suck the substrate sheet 10 onto the stage 50 may be adjusted by adjusting the size or the shape of each of the through holes 21.

(6) Inventive Example and Comparative Example (6-1) Inventive Example

In the inventive example, the substrate sheet 10 that is similar to the substrate sheet 10 in the above-described embodiment was subjected to the screen printing by using the underlay substrate 20 shown below.

Stainless steel (SUS304) was used as the material for the underlay substrate 20. The thickness of the underlay substrate 20 was 400 µm. The diameter of each of the through holes 21 of the underlay substrate 20 was 0.7 mm. The number of the through holes 21 was 80 in the end blank corresponding regions R14 of the underlay substrate 20, and the number of the through holes 21 was 80 in the end blank corresponding regions R15 of the underlay substrate 20. That is, the total area of the through holes 21 in the end blank corresponding regions R14 of the underlay substrate 20 and the total area of the through holes 21 in the end blank corresponding regions R15 of the underlay substrate 20 were both set to be about 30 mm$^2$. Note that the thickness of the substrate sheet 10 was 40 µm.

The above-described substrate sheet 10 and underlay substrate 20 were placed on the stage 50 so as to vertically overlap with each other, and sucked onto the stage 50 under vacuum. In the state, the substrate sheet 10 and the screen plate 55 are brought into contact with each other, and lead-free solder paste was printed on the substrate formation regions R2 of the substrate sheet 10 through the screen plate 55, thereby forming solder bumps.

After this, when the stage 50 was lowered, the substrate sheet 10 was completely separated from the screen plate 55 without moving away from the stage 50.

(6-2) Comparative Example

In the comparative example, the substrate sheet 10 that is similar to the substrate sheet 10 of the inventive example was subjected to the screen printing by using the underlay substrate 20 that is similar, excluding the following points, to the underlay substrate 20 of the inventive example.

The number of the through holes 21 in the end blank corresponding regions R14 of the underlay substrate 20 was 140, and the number of the through holes 21 in the end blank corresponding regions R15 of the underlay substrate 20 was 80. That is, the total area of the through holes 21 in the end blank corresponding regions R14 of the underlay substrate 20 was set to be about 55 mm$^2$, and the total area of the through holes 21 in the end blank corresponding regions R15 of the underlay substrate 20 was set to be about 30 mm$^2$.

When the stage 50 was lowered after the solder bumps were formed in the substrate formation regions R2 of the substrate sheet 10 similarly to the above-described inventive example, portions in the vicinity of the end blank regions R4 of the substrate sheet 10 moved away from the stage 50 and remained adhered to the screen plate 55. This caused the substrate sheet 10 to be folded and damaged.

(6-3) Evaluation

It was found that the substrate sheet 10 could be reliably separated from the screen plate 55 after the printing by setting the number of the through holes 21 in the end blank corresponding regions R14 of the underlay substrate 20 and the number of the through holes 21 in the end blank corresponding regions R15 of the underlay substrate 20 to be equal to each other.

(7) Correspondences Between Elements in the Claims and Parts in Embodiments

In the following paragraphs, non-limiting examples of correspondences between various elements recited in the claims below and those described above with respect to various embodiments of the present invention are explained.

In the above-described embodiment, the stage 50 is an example of a suction stage, the region on the one side of the substrate sheet 10 with the center line CL1 as its boundary is an example of a first region, the region on the other side of the substrate sheet 10 with the center line CL1 as its boundary is an example of a second region, a region on one side of the substrate formation regions R2 with the center line CL1 as its boundary is an example of a first printed circuit substrate formation region, the region on the one side of the blank region R10 with the center line CL1 as its boundary is an example of a first blank region, a region on the other side of the substrate formation regions R2 with the center line CL1 as its boundary is an example of a second printed circuit substrate formation region, and the region on the other side of the blank region R10 with the center line CL1 as its boundary is an example of a second blank region.

The region on the one side of the blank corresponding region R20 with the center line CL2 as its boundary is an example of a first blank corresponding region, the region on the other side of the blank corresponding region R20 with the center line CL2 as its boundary is an example of a second blank corresponding region, the through hole 21 in the region on the one side of the blank corresponding region R20 with the center line CL2 as its boundary is an example of a first through hole, the through hole 21 in the region on the other side of the blank corresponding region R20 with the center line CL2 as its boundary is an example of a second through hole.

One of the end blank regions R4, R5 is an example of a first end blank region, the other of the end blank regions R4, R5 is an example of a second end blank region, one of the end blank corresponding regions R14, R15 is an example of a first end blank corresponding region, the other of the end blank corresponding regions R14, R15 is an example of a second end corresponding region.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A screen printing method comprising the steps of:
   fixing a substrate sheet for manufacturing a printed circuit substrate on a suction stage by vacuum suction with an underlay substrate sandwiched therebetween;
   arranging a screen plate on said substrate sheet;
   printing a material on said substrate sheet through said screen plate; and
   separating said substrate sheet from said screen plate, wherein
   said substrate sheet is sectioned into first and second regions having an equal area, said first region includes a first printed circuit substrate formation region and a first blank region, said second region includes a second printed circuit substrate formation region and a second blank region, an area of said first blank region and an area of said second blank region are different from each other,
   said underlay substrate includes first and second blank corresponding regions that, when said underlay substrate is overlapped with said substrate sheet, face said first and second blank regions of said substrate sheet, respectively,
   one or plurality of first through holes are formed in said first blank corresponding region, one or plurality of second through holes are formed in said second blank corresponding region, and
   a sum of areas of said first through holes and a sum of areas of said second through holes are equal to each other.

2. A manufacturing method of a printed circuit substrate, comprising the steps of:
   fixing a substrate sheet for manufacturing the printed circuit substrate on a suction stage by vacuum suction with an underlay substrate sandwiched therebetween;
   arranging a screen plate on said substrate sheet;
   printing a material on said substrate sheet through said screen plate;
   separating said substrate sheet from said screen plate; and
   detaching the printed circuit substrate from said substrate sheet, wherein
   said substrate sheet is sectioned into first and second regions having an equal area, said first region includes a first printed circuit substrate formation region and a first blank region, said second region includes a second printed circuit substrate formation region and a second blank region, an area of said first blank region and an area of said second blank region are different from each other,
   said underlay substrate includes first and second blank corresponding regions that, when said underlay substrate is overlapped with said substrate sheet, face said first and second blank regions of said substrate sheet, respectively,
   one or plurality of first through holes are formed in said first blank corresponding region, one or plurality of second through holes are formed in said second blank corresponding region, and
   a sum of areas of said first through holes and a sum of areas of said second through holes are equal to each other.

* * * * *